United States Patent
Deng et al.

(10) Patent No.: US 8,432,760 B2
(45) Date of Patent: Apr. 30, 2013

(54) METHOD OF SCREENING STATIC RANDOM ACCESS MEMORIES FOR UNSTABLE MEMORY CELLS

(75) Inventors: Xiaowei Deng, Plano, TX (US); Wah Kit Loh, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 178 days.

(21) Appl. No.: 13/189,675

(22) Filed: Jul. 25, 2011

(65) Prior Publication Data

US 2013/0028036 A1    Jan. 31, 2013

(51) Int. Cl.
    *G11C 29/00*      (2006.01)

(52) U.S. Cl.
    USPC .......................... 365/201; 365/154

(58) Field of Classification Search .................. 365/201, 365/154, 191
See application file for complete search history.

(56) References Cited

U.S. PATENT DOCUMENTS

| | | | |
|---|---|---|---|
| 6,658,604 B1 * | 12/2003 | Corbin et al. ................. | 714/700 |
| 2004/0201399 A1 * | 10/2004 | Sher et al. ..................... | 324/765 |

OTHER PUBLICATIONS

Agostinelli et al., "Erratic Fluctuation of SRAM Cache Vmin at the 90nm Process Technology Node", Technical Digest of the International Electron Devices Meeting (IEEE, 2005), pp. 671-674.
Carlson, "Mechanism of Increase in SRAM Vmin Due to Negative-Bias Temperature Instability", Trans. on Device and Materials Reliability, vol. 7, No. 3 (IEEE, 2007), pp. 473-478.
Tega et al., "Impact of Threshold Voltage Fluctuation due to Random Telegraph Noise on Scaled-Down SRAM", 2008 International Reliability Physics Symposium (IEEE, 2008), pp. 541-546.
Toh et al., "Impact of Random Telegraph Signals on Vmin in 45nm SRAM", Technical Digest of the International Electron Devices Meeting (IEEE, 2009), pp. 767-770.

* cited by examiner

*Primary Examiner* — Vu Le
(74) *Attorney, Agent, or Firm* — Rose Alyssa Keagy; Wade J. Brady, III; Frederick J. Telecky, Jr.

(57) ABSTRACT

A screening method for testing solid-state memories for the effects of long-term shift and random telegraph noise (RTN). In the context of static random access memories (SRAMs), each memory cell in the array is functionally tested with a bias voltage (e.g., the cell power supply voltage) at a severe first guardband sufficient to account for worst case long-term shift and RTN effects. Cells failing the first guardband are then repeatedly tested with the bias voltage at a second guardband, less severe than the first guardband; if the tested cells pass this second guardband, the suspect cells are considered to not be vulnerable to RTN effects. Over-screening due to an unduly severe guardband is avoided, while still screening vulnerable memories from the population.

27 Claims, 9 Drawing Sheets

METHOD OF SCREENING STATIC RANDOM ACCESS MEMORIES FOR UNSTABLE MEMORY CELLS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to the manufacture and testing of static random access memories (SRAMs).

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

An example of a conventional SRAM cell is shown in FIG. 1. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel load transistor 3a and n-channel driver transistor 4a, and the other inverter of series-connected p-channel load transistor 3b and n-channel transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel pass-gate transistor 5a has its source/drain path connected between storage node SNT and bit line $BLT_k$ for the $k^{th}$ column, and n-channel pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

In operation, bit lines $BLT_k$, $BLB_k$ are typically precharged to a high voltage (at or near power supply voltage $V_{dda}$), and are equalized to the same voltage. To access cell 2 for a read operation, word line $WL_j$ is then energized, turning on pass-gate transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

As mentioned above, device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node SNT of cell 2 of FIG. 1, if bit line $BLT_k$ is unable to sufficiently discharge storage node SNT to a sufficient level to trip the inverters, cell 2 may not latch to the desired data state.

Cell stability failures are the converse of write failures—while a write failure occurs if a cell is too stubborn in changing its state, a cell stability failure occurs if a cell changes its state too easily. Noise of sufficient magnitude coupling to the bit lines of unselected cells, for example during a write to a selected memory cell in the same row, can cause a false write of data to unselected cells in that same row. In effect, such write cycle noise can be of sufficient magnitude as to trip the inverters of one or more of the unselected cells (i.e., the "half-selected" cells in unselected columns of the selected row). The possibility of such stability failure is exacerbated by device mismatch and variability, as discussed above.

As known in the art, an important measure of the functionality of an SRAM memory cell is the minimum power supply voltage (i.e., the differential voltage between array power supply voltage $V_{dda}$ and array reference voltage $V_{ssa}$ in the arrangement of FIG. 1) at which that memory cell can be successfully written and read. It is desirable that this minimum power supply voltage be as low as possible, particularly for memories to be implemented in portable and other battery-powered or otherwise power-sensitive applications. This minimum power supply voltage is referred to in the art as "Vmin".

In modern SRAMs constructed with sub-micron feature sizes, the measure of Vmin will vary from cell to cell within an array, and therefore within the same multiple-array or multiple-block integrated circuit. This cell-to-cell variation stems from such known effects as random dopant fluctuation ("RDP"), line-end roughness ("LER"), and the like, which introduce observable variations among populations of transistors in the deep sub-micron regime. As a result, the Vmin for a particular memory will be determined by the cell within that memory with the poorest (i.e., highest) Vmin measurement.

It has been observed that Vmin tends to degrade over operating life in conventional CMOS SRAMs. An important mechanism in this regard is negative bias temperature instability ("NBTI"), which appears as an increase in threshold voltage over operating time. NBTI degradation affects primarily p-channel MOS transistors in modern CMOS integrated circuits, and adversely affects memory cell Vmin. Conventional manufacturing test flows for sub-micron CMOS SRAMs now commonly includes a "guardband" voltage to the power supply voltage during one or more functional tests. This reduced power supply voltage screens out (or invokes replacement via redundant rows or columns) those devices with a Vmin that is close to the pass/fail threshold at manufacture, within a margin corresponding to the expected NBTI drift over the desired operating life.

Another recently observed effect in deep sub-micron transistors is referred to in the art as "Random Telegraph Noise" ("RTN"). Physical defects within the gate dielectric of MOS transistors can trap charge during device operation, typically in response to bias on the transistor; other bias conditions or thermal effects can later "de-trap" or release that trapped charge. The trapping and de-trapping of charge via this mechanism is essentially a random process over time (mimicking the "dots" and "dashes" of a telegraph signal, as reflected in the common name of this mechanism). This trapping and de-trapping mechanism has an electrical effect of modulating the threshold voltage of the transistor. With the extremely small feature sizes and extremely thin gate dielectrics in modern MOS transistors, the trapping and de-trapping of even a single charge within the gate dielectric is reflected by variations in the transistor threshold voltage of as much as 10 to 20 mV. This mechanism can also cause fluctuations in the gate leakage of the transistor, with or without noticeable threshold voltage modulation.

In the SRAM context, the effects of RTN are observed as erratic changes in Vmin of memory cells over time, specifically with the affected bit failing a Vmin threshold due to a write failure, a cell stability failure during read cycles (or during a "dummy" read for half-selected cells in a write cycle), a data retention failure, or a data read failure (e.g., inadequate read current). A memory cell exhibiting such erratic failures over time is commonly referred to in the art as an unstable bit. Repeated testing of such an unstable bit with the same functional test pattern will fail a particular Vmin threshold at random times and pass at other times, with the random failures due to any of the above causes (write failure, stability failure, retention failure, data read failure) depending on the particular transistor parameters in that cell and on the bias and operational environment. This random behavior in repeated testing is described in Agostinelli et al., "Erratic Fluctuation of SRAM Cache Vmin at the 90 nm Process Technology Node", *Technical Digest of the International Electron Devices Meeting* (IEEE, 2005), pp. 671-674, in which the probability distribution of Vmin fluctuation is described as depending on the number of observations, with the tail of the Vmin range distribution increasing with the number of observations.

The combination of RTN gate leakage or threshold shift, with the time-dependent threshold shift of NBTI, increases the possible threshold voltage shift in an SRAM over time. This necessitates an even larger guardband on the Vmin test at manufacture, in order to screen out those devices that may fail over time due to NBTI shift and that may experience the additional Vmin degradation from temporarily trapped charge due to RTN, essentially by increasing the test to a safer Vmin level. While this increased guardband will generally be effective to remove those devices subject to both NBTI and RTN, it is believed that such a severe guardband will also remove devices that, while having a Vmin close to but passing the NBTI-only guardband, will not exhibit RTN threshold shift, and would thus be reliable over the expected system life. Especially as feature sizes continue to shrink with advances in technology, the financial impact of yield loss from these "false failures" will become even more significant.

Similar memory cell failures due to the combination of RTN threshold shift with the time-dependent threshold shift of NBTI have also been observed in other memory cell types, including read-only memories (electrically programmable or mask programmable). Of course, some forms of read-only memories cannot be "written" with a false data state; in those cases, upsets due to RTN threshold shift and time-dependent threshold shift of NBTI manifest in these memories as read failures, in which the read data state applied to bit lines differs from the state persistently stored in the memory cell.

BRIEF SUMMARY OF THE INVENTION

Embodiments of this invention provide a method of testing memories that are vulnerable to both time-dependent degradation and random telegraph noise (RTN) effects.

Embodiments of this invention further provide such a method that reduces yield loss due to overscreening.

Embodiments of this invention further provide such a method that also reduces the number of "escapes" of later-life failures.

Embodiments of this invention further provide such a method that can be carried out efficiently, using conventional test equipment.

Embodiments of this invention further provide such a method that is suitable for use with embedded memories.

Other advantages of embodiments of this invention will be apparent to those of ordinary skill in the art having reference to the following specification together with its drawings.

Embodiments of this invention may be implemented into an automated test program or sequence, by first functionally testing a population of memory cells at a bias voltage at a relatively large first guardband voltage. The first guardband voltage corresponds to a voltage sufficient to encompass the effects of predictable time-dependent degradation and also the effects of random telegraph noise (RTN). Memories or groups of memory cells including one or more cells failing the first functional test are then repetitively functionally tested at a bias voltage at a reduced guardband voltage; this reduced guardband voltage is at or exceeds the voltage shift corresponding to time-dependent degradation, and the repeated testing provides opportunity for failure due to RTN effects. Devices that pass this repetitive second guardband testing are identified as suitable for system use.

DETAILED DESCRIPTION OF THE INVENTION

This invention will be described in connection with certain embodiments, namely as implemented into a method of testing static random access memories, because it is contemplated that this invention will be especially beneficial when used in such an application. However, it is also contemplated that embodiments of this invention will also be beneficial if applied to memories of other types, including read-only memories and electrically programmable read-only memories, among others. Accordingly, it is to be understood that the following description is provided by way of example only, and is not intended to limit the true scope of this invention as claimed.

Figure 2:
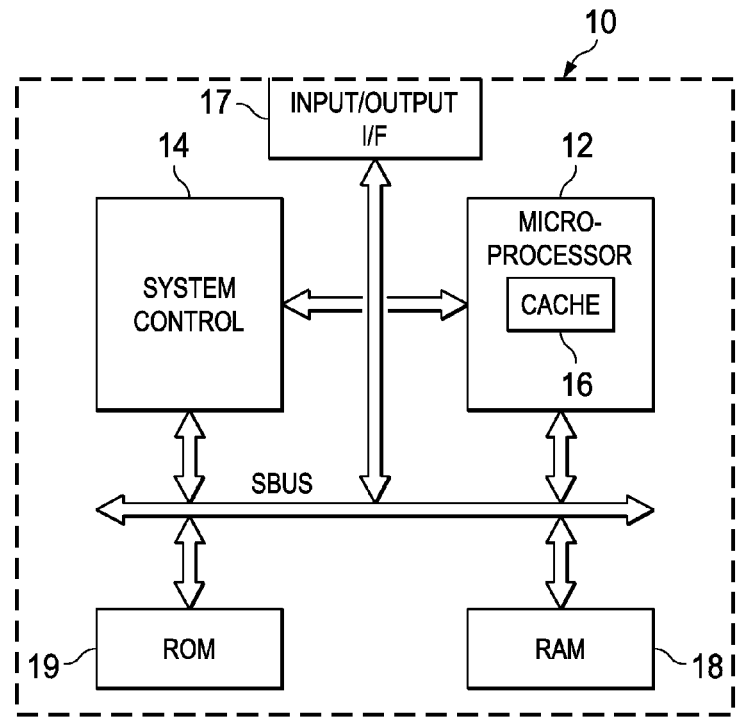
FIG. 2 is an electrical diagram, in block form, of a large-scale integrated circuit in which memory resources are implemented, and to which embodiments of the invention are applied.

FIG. 2 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and read-only memory (ROM) 19, reside on system bus SBUS and are thus accessible to microprocessor 12. Typically, ROM 19 serves as program memory, storing the program instructions executable by microprocessor 12, while RAM 18 serves as data memory; in some cases, program instructions may reside in RAM 18 for recall and execution by microprocessor 12. Cache memory 16 (such as level 1, level 2, and level 3 caches, each typically implemented as SRAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of this invention.

Figure 3:
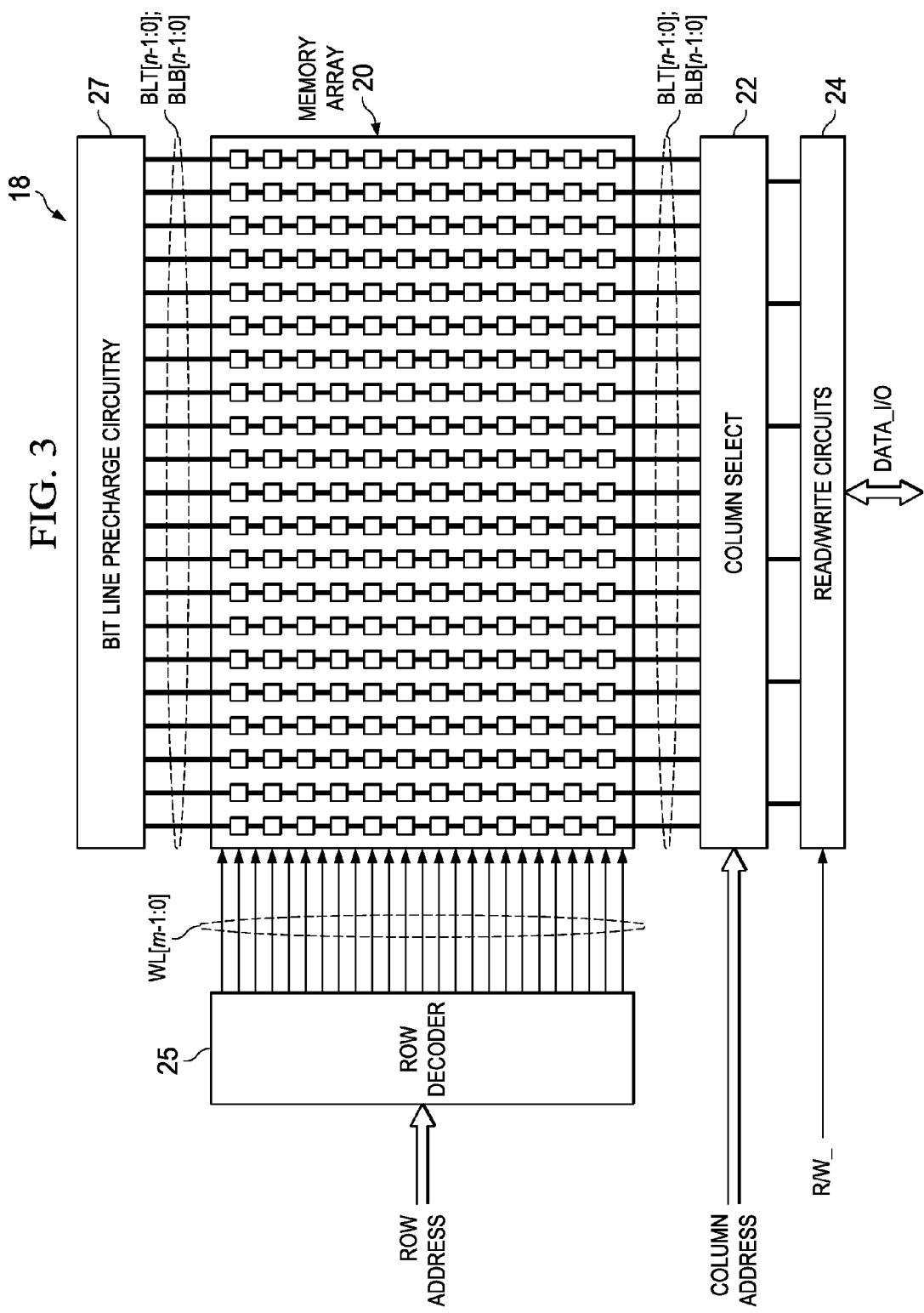
FIG. 3 is an electrical diagram, in block form, of a random access memory in the integrated circuit of FIG. 2, to which embodiments of the invention are applied.

Further detail in connection with the construction of RAM 18 in integrated circuit 10 is illustrated in FIG. 3. Of course, a similar construction may be used to realize other memory resources such as cache memory 16; further in the alternative, RAM 18 may correspond to a stand-alone memory integrated circuit (i.e., rather than as an embedded memory as shown in FIG. 2). Those skilled in the art having reference to this specification will comprehend that the memory architecture of RAM 18 in FIG. 3 is provided by way of example only.

In this example, RAM 18 includes many memory cells arranged in rows and columns within memory array 20. While a single instance of memory array 20 is shown in FIG. 3, it is to be understood that RAM 18 may include multiple memory arrays 20, each corresponding to a memory block within the address space of RAM 18. The construction of these memory cells according to embodiments of this invention will be described in further detail below. In this example, memory array 20 includes m rows and n columns of SRAM cells, with cells in the same column sharing a pair of bit lines BLT[n−1:0], BLB[n−1:0], and with memory cells in the same row sharing one of word lines WL[m−1:0]. Bit line precharge circuitry 27 is provided to apply a desired precharge voltage to the pairs of bit lines BLT[n−1:0], BLB[n−1:0] in advance of read and write operations. Row decoder 25 receives a row address value indicating the row of memory array 20 to be accessed, and energizes the one of word lines WL[m−1:0] corresponding to that row address value. Column select circuit 22 receives a column address value, and in response selects pairs of bit lines BLT[n−1:0], BLB[n−1:0] associated with one or more columns to be placed in communication with read/write circuits 24. Read/write circuits 24 are constructed in the conventional manner, for example to include the typical differential amplifier coupled to the bit lines for a column as selected by column select circuit 22 and a write circuit for selectively pulling toward ground one of the bit lines in the selected pair. The example of RAM 18 shown in FIG. 3 is constructed to an "interleaved" architecture, in which a given memory address selects one of every x (e.g., one of every four) columns for read or write access. The data words stored in memory array 20 are thus interleaved with one another, in the sense that the memory address decoded (in part) by column select circuit 22 selects one column in each group of columns, along the selected row. Alternatively, memory array 20 may be arranged in a non-interleaved fashion, in which each cell in the selected row is coupled to a corresponding read/write circuit in each cycle. In that architecture, read/write circuits 24 could reside between bit lines BL[n−1:0], and column select circuits 22, with the column select circuits selecting which read/write circuits 24 (and thus which columns) are in communication with data bus DATA I/O.

As discussed above in connection with the Background of the Invention, modern integrated circuits are now commonly constructed using extremely small minimum sized features, for example with metal-oxide-semiconductor (MOS) transistor gates having widths deep in the sub-micron regime. These extremely small transistor sizes cause variations in the electrical properties among the memory cells in array 20, relative to one another, due to such effects as random dopant fluctuation ("RDP"), line-end roughness ("LER"), and the like. As such, the cell stability, readability, and writeability will often vary among the memory cells in array 20.

Figure 1:
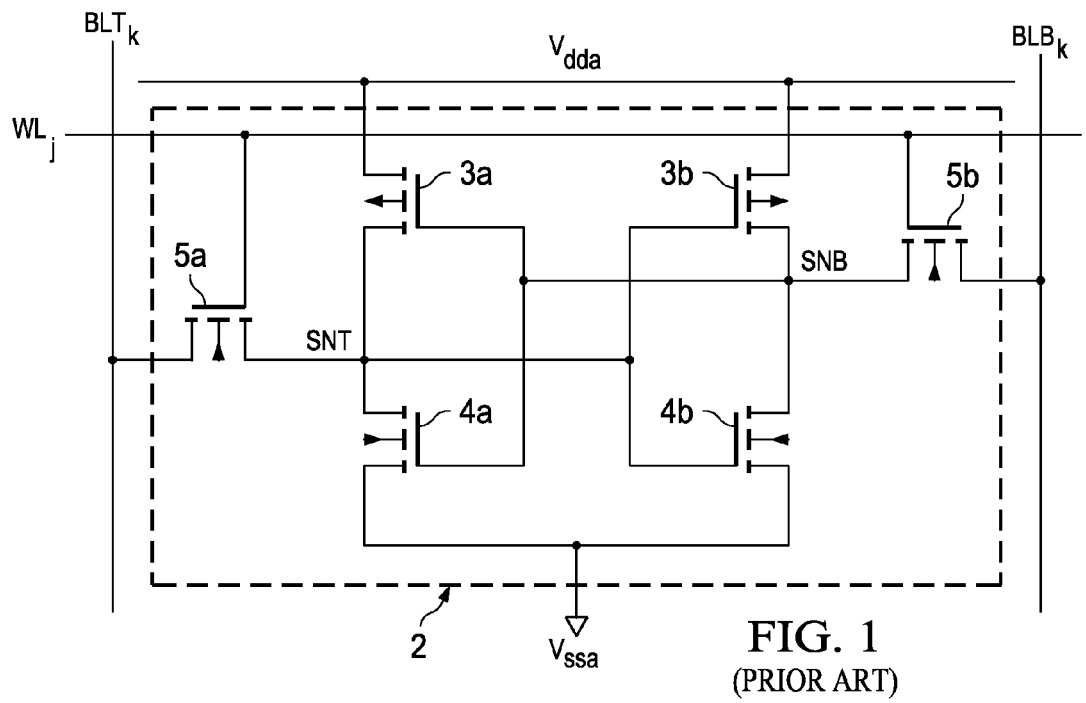
FIG. 1 is an electrical diagram, in schematic form, of a conventional static random access memory cell.

As discussed above, a useful measure of the stability, readability, and writeability of a static random access memory (SRAM) cell such as conventional 6-T memory cell 2 of FIG. 1 is the minimum power supply voltage (power supply voltage $V_{dda}$ relative to the reference or ground voltage $V_{ssa}$ of the cell) at which the cell can be successfully written, and at which the cell can retain its data state when disturbed (e.g., during writes to neighboring cells). For purposes of this description, "cell strength" will refer to the ability of a memory cell to properly function; in the case of an SRAM cell, "cell strength" refers to all of cell stability, readability, and writeability, while for the case of read-only memory cells (e.g., ROM 19 in FIG. 2), "cell strength" refers to readability. In any case, the minimum power supply voltage is typically referred to in the art as "Vmin", and has become a useful measure. For the reasons discussed above in connection with random dopant fluctuation ("RDP"), line-end roughness ("LER"), and other sub-micron effects, the measure Vmin will vary among the cells in a given memory array.

Figure 4A:
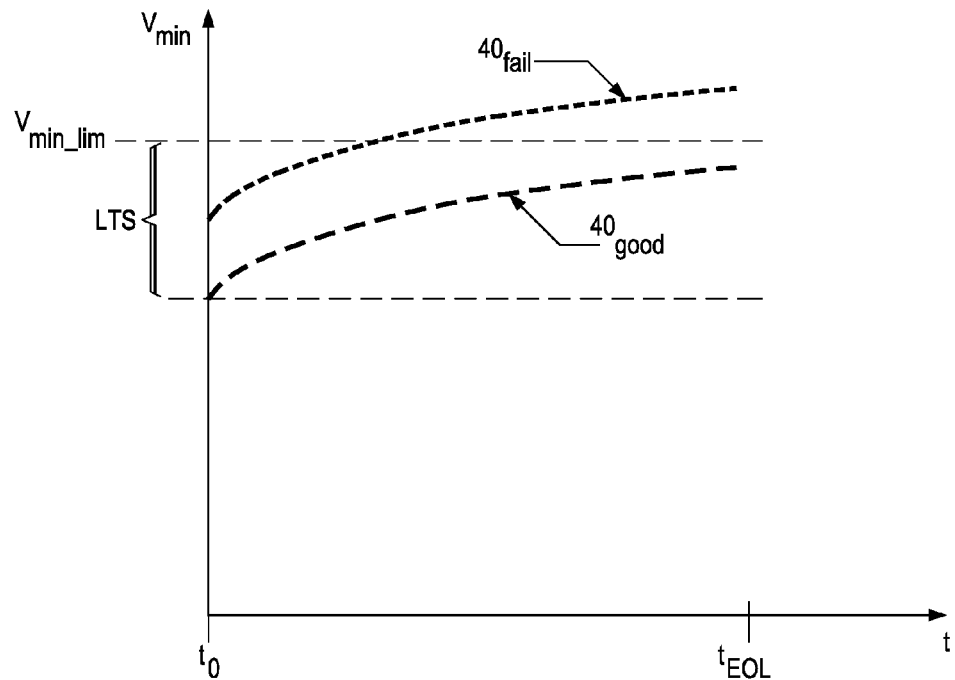
FIGS. 4a and 4b are voltage plots illustrating the failure mechanisms for which test methods according to embodiments of the invention are addressed.

FIG. 4a illustrates the behavior of Vmin over operating lifetime, as observed in modern sub-micron SRAM cells. In this FIG. 4a, the voltage Vmin_lim indicates the desired (maximum) limit of Vmin that an SRAM memory cell ought to meet throughout its useful operating life. But as discussed above, the deep sub-micron device sizes now commonly used in modern solid-state memories render memory cells vulnerable to the effects of negative bias temperature instability ("NBTI"), which is reflected in increased transistor threshold voltage over operating time. Curve $40_{good}$ illustrates the typical behavior of an SRAM cell over its operating life (time t), in which NBTI degradation occurs. Curve $40_{good}$ illustrates that the Vmin for a given cell increases over time from its value at manufacture (time $t_0$) and its value at the end of its operating life (time $t_{EOL}$), shifting by an amount shown as long-term shift (LTS). Curve $40_{fail}$ illustrates the same shift in Vmin over time, but for a memory cell that has a higher initial Vmin value at time $t_0$. As evident from curve $40_{fail}$, the maximum limit Vmin_lim is exceeded for this cell well prior to end of life at $t_{EOL}$. The memory cell represented by this curve $40_{fail}$ would pass a Vmin test (i.e., meeting limit Vmin_lim) at time $t_0$, but eventually the long-term shift would cause the cell to fail within its operating life. As described above, conventional memory test sequences therefore functionally test Vmin at a lower limit (e.g., limit Vmin_lim reduced by a "guardband" corresponding to the expected long-term shift LTS).

Figure 4B:
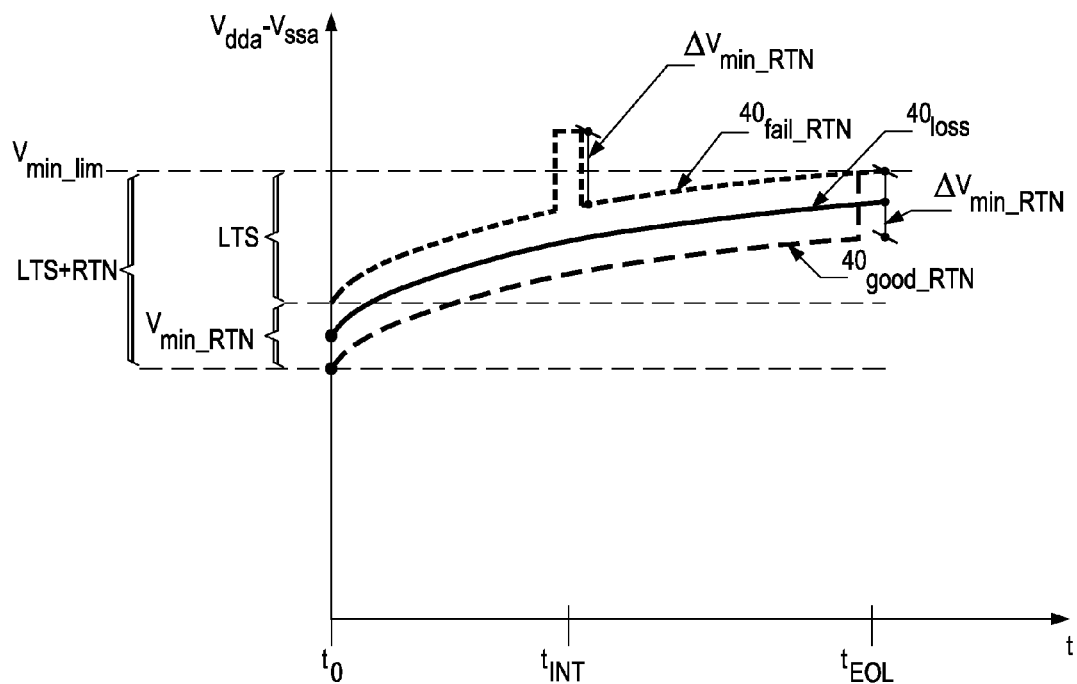

These small feature sizes also render the transistors in modern memory cells vulnerable to the effect of "Random Telegraph Noise" ("RTN"), which as discussed above, is reflected in intermittent modulation of the gate leakage or threshold voltage (or both) of the transistor over time. This intermittent gate leakage or threshold voltage modulation (e.g., increases in the threshold voltage of the p-channel load transistors 3a, 3b in cell 2 of FIG. 1) directly affects the Vmin of the memory cell. FIG. 4b illustrates this effect. Curve $40_{fail\_RTN}$ illustrates the Vmin behavior of a memory cell over time, with its Vmin shifting by the same long-term shift (LTS) as shown in FIG. 4a. However, slightly prior to time $t_{INT}$, an RTN event has occurred at this memory cell, causing a corresponding increase in the Vmin by an amount ΔVmin_RTN for this memory cell at time $t_{INT}$. This increased Vmin in curve $40_{fail\_RTN}$ causes this memory cell to violate the maximum limit Vmin_lim, even though its nominal (i.e., "steady-state") Vmin behavior over time would not violate that limit Vmin_lim.

A conventional approach to screening out memories with behavior such as shown by curve $40_{fail\_RTN}$ is to increase the guardband to also include the possible effect of both the long-term shift LTS and also the effects of RTN. As shown in FIG. 4b, this guardband is illustrated by the voltage that is below limit Vmin_lim by the amount LTS+RTN. With that screen in place, memory cells with behavior illustrated by curve $40_{good\_RTN}$ in FIG. 4b, or better, would pass the time $t_0$ screen with this larger guardband, meeting limit Vmin_lim at the end of life $t_{EOL}$ despite an increased Vmin due to an RTN event occurring near the end of life. However, this increased guardband will also have the effect of identifying, as failures, those memory cells that do not exhibit RTN effects and that would meet limit Vmin_lim over the entire expected life. Curve $40_{loss}$ illustrates the behavior of a memory cell that would fail the increased guardband test at time $t_0$, but would meet limit Vmin_lim throughout its entire operating life because that cell does not exhibit threshold shifts due to RTN. Memories and memory cells with behavior similar to that shown by curve $40_{100}$ would thus be unnecessarily screened out by the tighter guardband of LTS+RTN below Vmin_lim. This yield loss can be substantial, causing significant economic loss to the manufacturer.

Embodiments of this invention are directed to test methods of detecting those memory cells (and the memories containing such memory cells) that will degrade over time to such an extent as to become unstable or difficult to write (in the case of random access memories), or vulnerable to read failures (in the case of read-only memories), without over-screening of those memories and memory cells that will remain stable and functional over the full operating life.

According to embodiments of this invention, cell strength (cell stability, readability, and writeability in RAM cells, and readability in ROM cells) can be evaluated by any one of several measurements. Each of these measurements achieve a similar result, but are carried out by varying different specific bias voltages applied to the memory cells, while those cells are being functionally operated. Referring now to FIGS. 5a through 5d, examples of the test conditions under which these measurements of cell strength can be quantified, according to embodiments of this invention, will now be shown in relation to SRAM cell $30_{jk}$, which resides in row j and column k of array 20 of FIG. 3, in the context of memory 18.

Figure 5A:
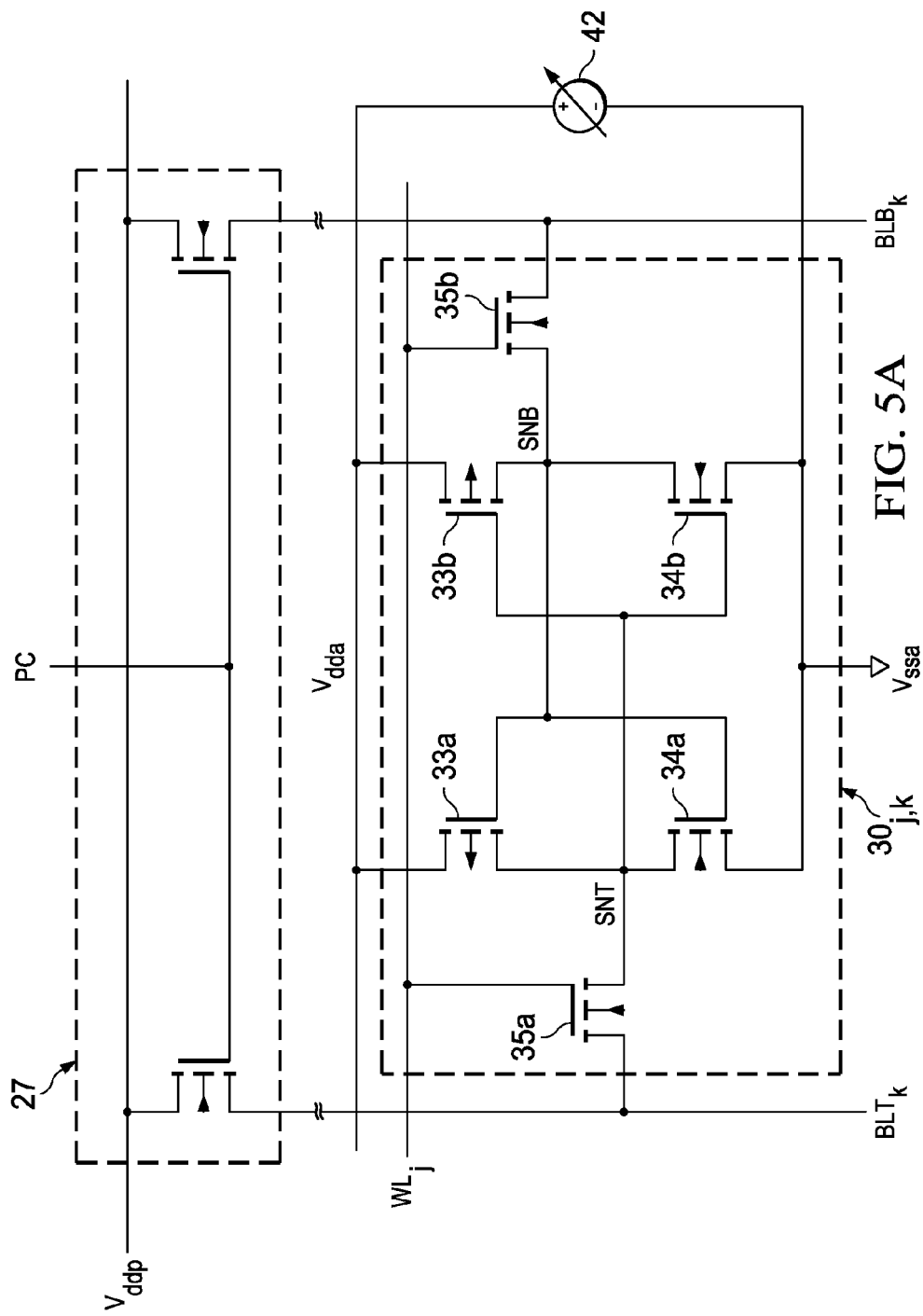
FIGS. 5a through 5d are electrical diagrams, in schematic form, illustrating various techniques for testing the memory of FIG. 3 according to embodiments of the invention.

Referring first to FIG. 5a, cell $30_{jk}$ includes, in the conventional manner, one CMOS inverter constructed from series-connected p-channel load transistor 33a and n-channel driver transistor 34a, and another CMOS inverter of series-connected p-channel load transistor 33b and n-channel transistor 34b. The gates of transistors 33a, 34a in one inverter are connected together and to the common drain node of transistors 33b, 34b of the opposite inverter at storage node SNB; similarly, the gates of transistors 33b, 34b are connected together and to the common drain node of transistors 33a, 34a at storage node SNT. N-channel pass-gate transistors 35a, 35b have their source/drain paths connected between storage nodes SNT, SNB, respectively, and respective bit lines $BLT_k$, $BLB_k$ for column k of array 20. Word line $WL_j$ for row j controls the gates of transistors 35a, 35b. At the beginning of each read or write cycle, precharge circuitry 27 precharges bit lines $BLT_k$, $BLB_k$ to a high voltage $V_{ddp}$ (which is at or near power supply voltage $V_{dda}$), and then releases bit lines $BLT_k$, $BLB_k$ to then float during the remainder of the access cycle.

In a general sense, write failures of cell $30_{jk}$ occurs if pass transistors 35a, 35b have relatively weak drive as compared with load transistors 33 and driver transistors 34. This situation results in weak coupling between the bit lines and storage nodes relative to the strong drive of the latched state at storage nodes SNT, SNB, causing the write of an opposite data state from that stored to be stubborn. Conversely, cell stability is threatened by pass transistors 35a, 35b having relatively strong drive as compared with that of load transistors 33 and driver transistors 34, because this enables the coupling between the bit lines and storage nodes to easily overcome the drive of the inverters in maintaining the previously stored state. In that condition, the storage nodes SNT, SNB have weak resistance to changing state.

SRAM cell $30_{jk}$, along with all cells 30 in array 20, is biased between the voltage on power supply line $V_{dda}$ and a ground reference voltage $V_{ssa}$. As mentioned above, in the context of static RAM 18, the voltage Vmin is a known measure of the minimum power supply voltage $V_{dda}$ relative to the reference or ground voltage $V_{ssa}$ at which a given cell $30_{jk}$ can be successfully written and read, and can retain its stored data state when disturbed. According to this embodiment of the invention, voltage Vmin can be directly determined by varying the power supply voltage $V_{dda}$ relative to the reference or ground voltage $V_{ssa}$, as indicated by variable power supply 42. Variable power supply 42 thus sets the particular bias voltage $V_{dda}$-$V_{ssa}$ at which cell $30_{jk}$ is to be functionally tested; this voltage $V_{dda}$-$V_{ssa}$ can be set at the desired limit to be tested, or varied to evaluate the particular Vmin level for cell $30_{jk}$ and others in array 20. As the bias voltage $V_{dda}$-$V_{ssa}$ is reduced, cell stability failures can occur more readily as the drive of the inverters of cell $30_{jk}$ is reduced at that lower bias; reduction in bias voltage $V_{dda}$-$V_{ssa}$ can also be reflected in a write failure, because of the reduced drive of the inverters of cell $30_{jk}$ in changing state in response to the one of bit lines $BLT_k$, $BLB_k$ driven low in the write cycle. The particular failure mechanism will depend on the relative drive capability of the transistors within cell $30_{jk}$, as described above. Of course, the setting or varying of this bias voltage $V_{dda}$-$V_{ssa}$ can be effected by setting or varying power supply voltage $V_{dda}$ while holding reference voltage $V_{ssa}$ constant (e.g., at ground), or by setting or varying reference voltage $V_{ssa}$ while holding power supply voltage $V_{dda}$ constant.

Figure 5B:
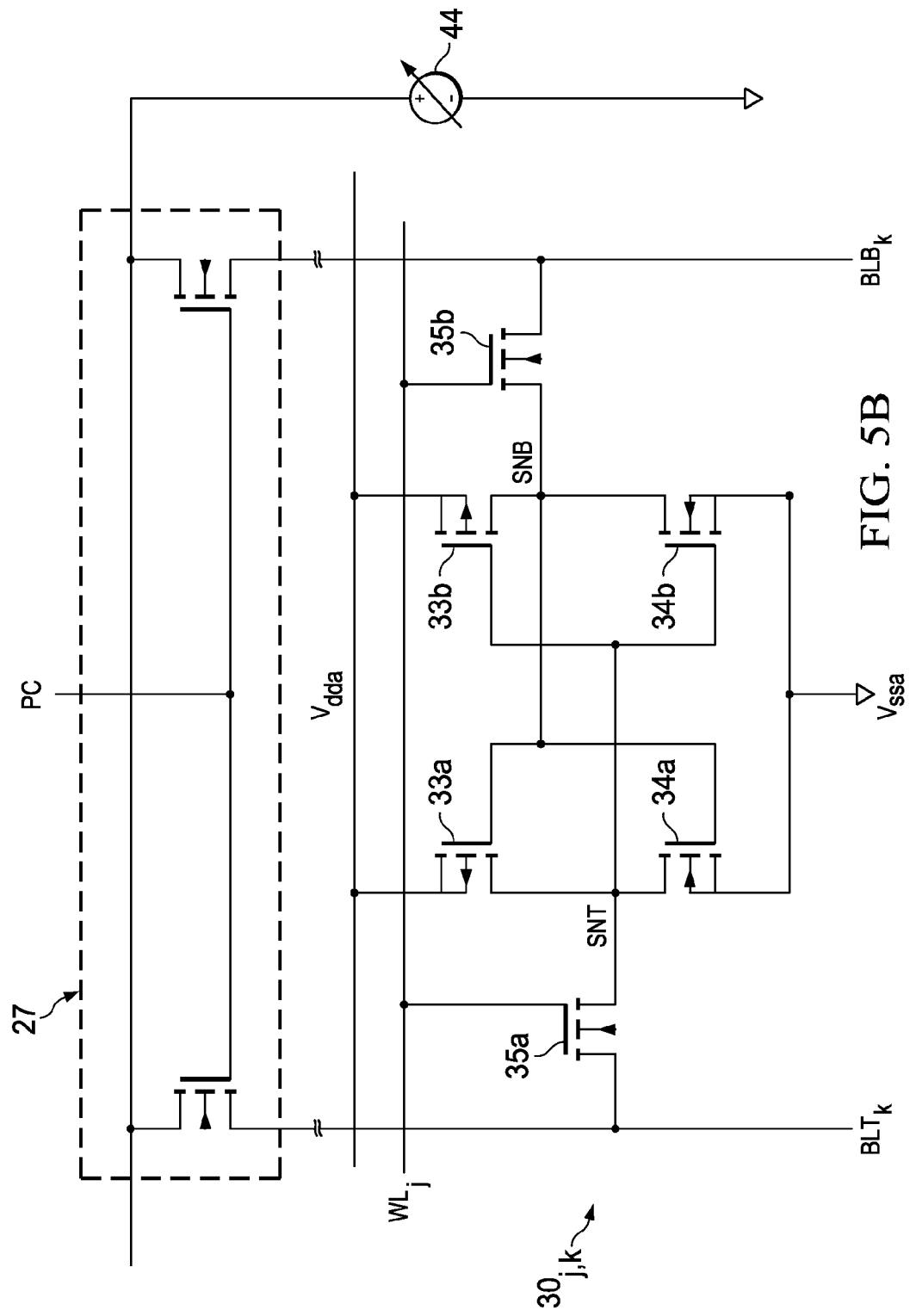

FIG. 5b illustrates another approach to evaluating cell stability, readability, and writeability for cell $30_{jk}$. In this approach, variable power supply 44 sets the power supply voltage $V_{ddp}$ to which bit lines $BLT_k$, $BLB_k$ are precharged. As bit lines $BLT_k$, $BLB_k$ are precharged to a voltage higher than array bias voltage $V_{dda}$, half-selected cells $30_{jk}$ in unselected columns of selected row j can have their "0" storage nodes connected to a precharged-high bit line $BLT_k$, $BLB_k$ through the corresponding pass transistor 35a, 35b (which are turned on for the selected row j). This higher precharged voltage will thus attempt to over-write the "0" level storage node, if sufficiently strong to overcome the cross-coupled inverter drive. Conversely, the writeability of cell $30_{jk}$ is also weakened by this higher precharge voltage, as the task of the write driver in pulling low the one of bit lines $BLT_k$, $BLB_k$ indicated by the input data state becomes more difficult. As such, the measurement of cell stability, readability, and writeability of cell $30_{jk}$ can be evaluated by setting or varying precharge voltage $V_{ddp}$ as shown in FIG. 5b.

Figure 5C:
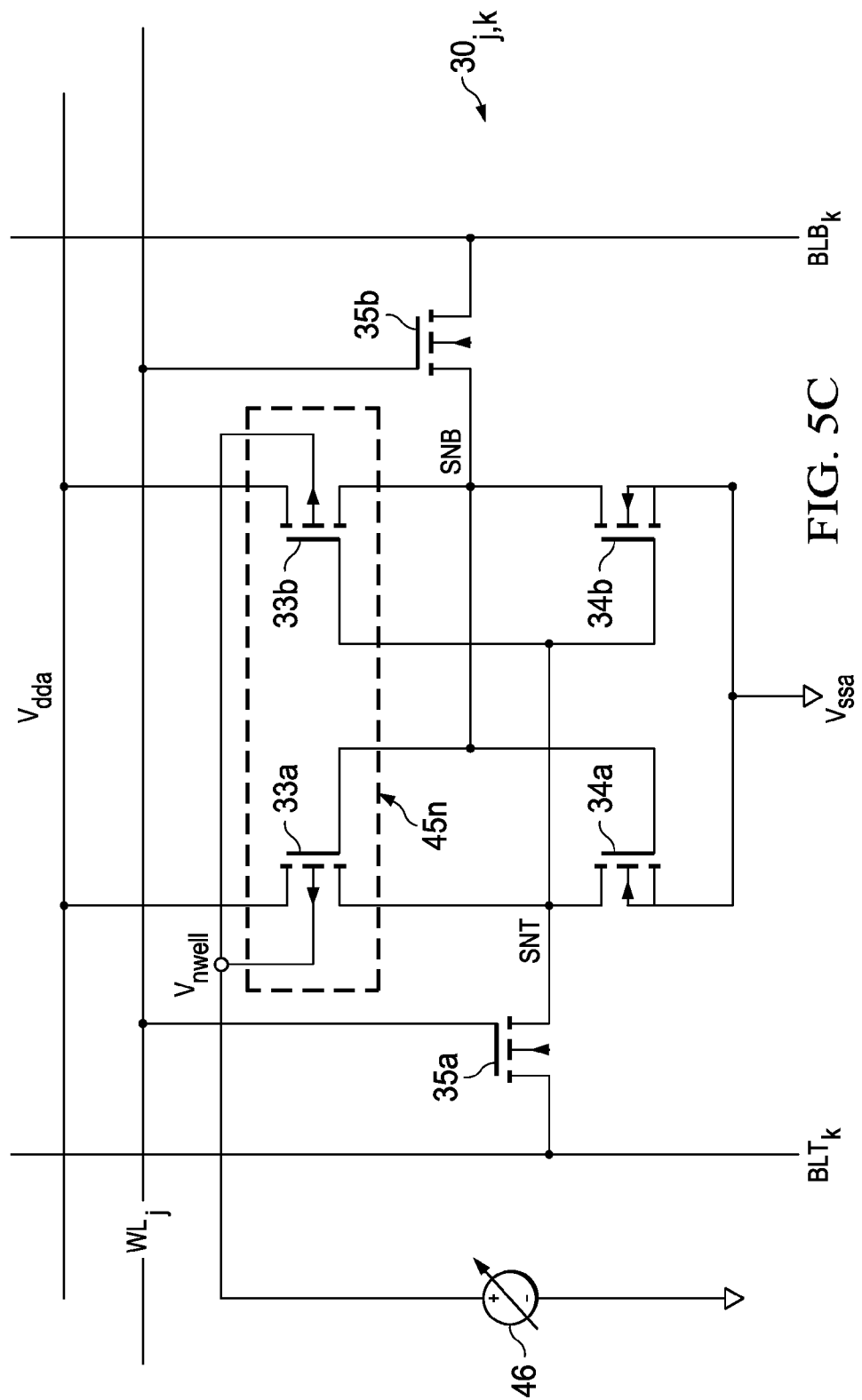

As described above, the direct effect of the mechanisms of NBTI and RTN on cell $30_{jk}$ is an effective increase in the threshold voltage of the transistors in cell $30_{jk}$. According to another implementation, as shown in FIG. 5c, the bias voltage that is set or varied in the evaluation of cell strength of cell $30_{jk}$ is the back-gate bias of p-channel load transistors 33a, 33b of cell $30_{jk}$. As known in the art, p-channel MOS transistors commonly have their body nodes (i.e., back-gate bias) tied to their sources, for example as shown in the arrangement of cell $30_{jk}$ in FIGS. 5a and 5b. Also as known in the art, increasing this back-gate bias voltage relative to power supply voltage $V_{dda}$ (i.e., as compared with the source voltage) has the effect of increasing the threshold voltage of p-channel transistors 33a, 33b, which reduces their drain-to-source drive current under constant source/drain/gate bias conditions. FIG. 5c illustrates variable power supply 46, which sets or varies bias voltage $V_{nwell}$ that is applied to n-well 45n within which p-channel transistors 33a, 33b are disposed, and that therefore sets or varies the back-gate bias of those transistors 33a, 33b. As such, the measurement of cell stability, readability, and writeability of cell $30_{jk}$ can be evaluated by setting or varying n-well voltage $V_{nwell}$ as shown in FIG. 5c.

Figure 5D:
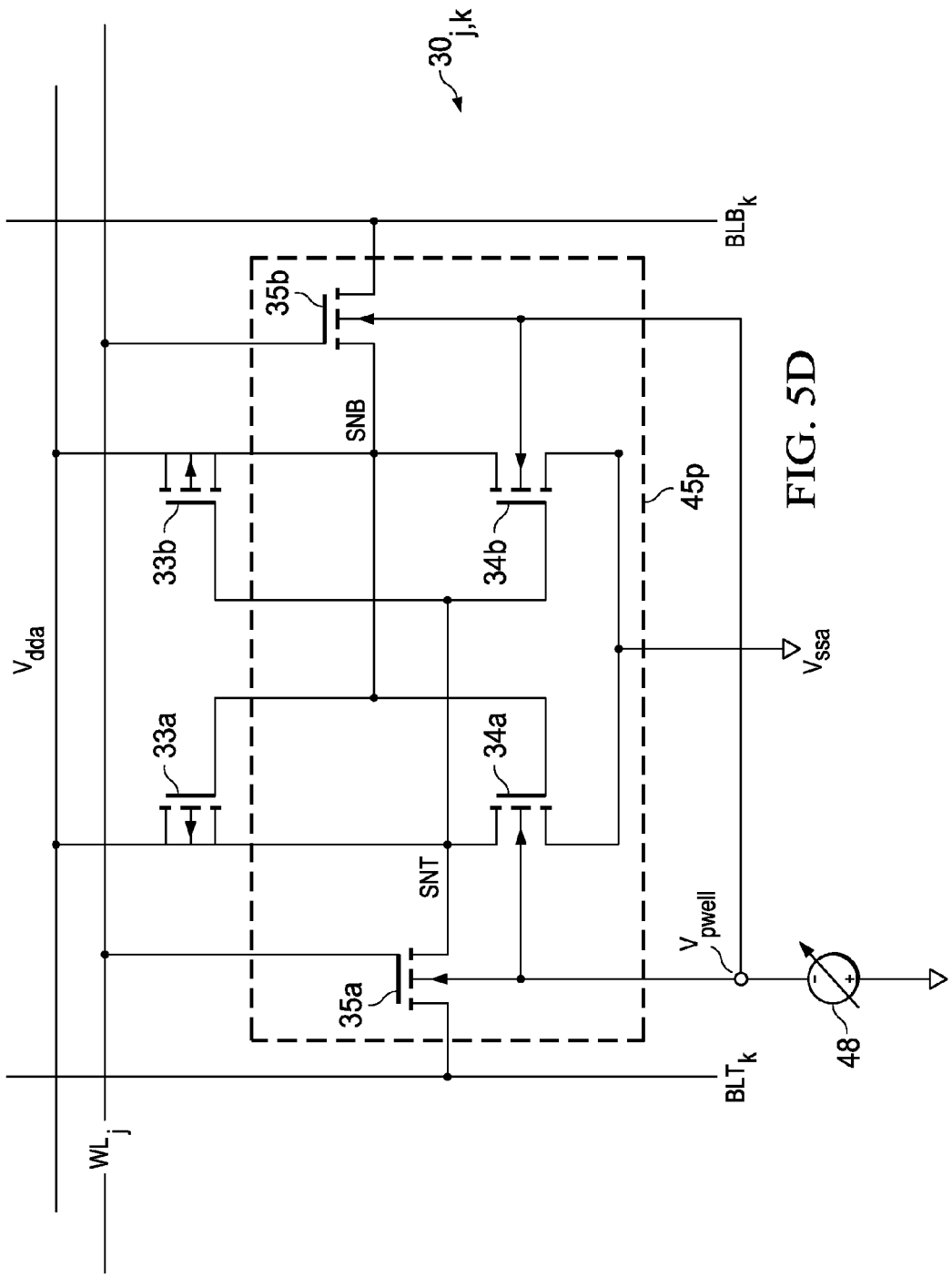

FIG. 5d illustrates another approach to increasing the threshold voltage of transistors in cell $30_{jk}$, as useful in evaluating cell strength. In this implementation, the bias voltage that is set or varied in the evaluation of cell strength of cell $30_{jk}$ is the back-gate bias of n-channel driver transistors 34a, 35b, and also the back-gate bias of re-channel pass transistors 35a, 35b, all in cell $30_{jk}$. As in the case of p-channel transistors 33a, 33b of FIG. 5c, n-channel MOS transistors 34a, 34b nominally have their body nodes (i.e., back-gate bias) tied to their sources, which in the example of FIGS. 5a through 5c is at ground voltage $V_{ssa}$. Decreasing the back-gate bias voltage of n-channel transistors 34a, 34b (i.e., setting it more negative) relative to ground voltage $V_{ssa}$ (i.e., as compared with the voltage at the source) has the effect of increasing the threshold voltage of those transistors 34a, 34b, reducing their drain-to-source drive current under constant source/drain/gate bias conditions. In the arrangement of FIG. 5d, variable power supply 48 sets or varies bias voltage $V_{pwell}$ that is applied to p-well 45p within which re-channel transistors 34a, 34b (and 35a, 35b) are disposed, to set or vary the back-gate bias of those transistors 34, 35. As such, the measurement of cell stability, readability, and writeability of cell $30_{jk}$ can be evaluated by setting or varying p-well voltage $V_{pwell}$ as shown in FIG. 5d.

To summarize, therefore, the cell strength of SRAM cell $30_{jk}$ can be measured or evaluated by the setting or varying of the voltages specified in Table I:

TABLE I

| Vmin (or proxy) | Bias voltage | Direction of variation to weaken the cell (increasing guardband) |
| --- | --- | --- |
| Vmin ($V_{dda}$-$V_{ssa}$) | $V_{dda}$ | decrease |
|  | $V_{ssa}$ | increase |
| Bit line precharge voltage | $V_{ddp}$ | increase |
| PMOS $V_t$ | $V_{nwell}$ | increase |
| NMOS $V_t$ | $V_{pwell}$ | decrease (more negative) |

According to embodiments of the invention described in this specification, therefore, references to setting or varying the "bias voltage" applied to 6-T SRAM cell $30_{jk}$ can be one or more of the various voltages illustrated in this Table I, with the direction (increase or decrease in the indicated bias voltage) of increasing guardband also as indicated. For example, to increase the guardband in the Vmin test in which the n-channel MOS transistor threshold voltage is the control variable, one would set the p-well voltage $V_{pwell}$ more negative, relative to ground voltage $V_{ssa}$. It is contemplated that those skilled in the art having reference to this specification will comprehend these and other voltages suitable for setting and varying in connection with embodiments of this invention for the case of 6-T SRAM cells 30*, and such other voltages that may be applicable to evaluating the cell strength of other types of memory cells and memory architectures beyond CMOS SRAM cells, without undue experimentation.

Figure 6A:
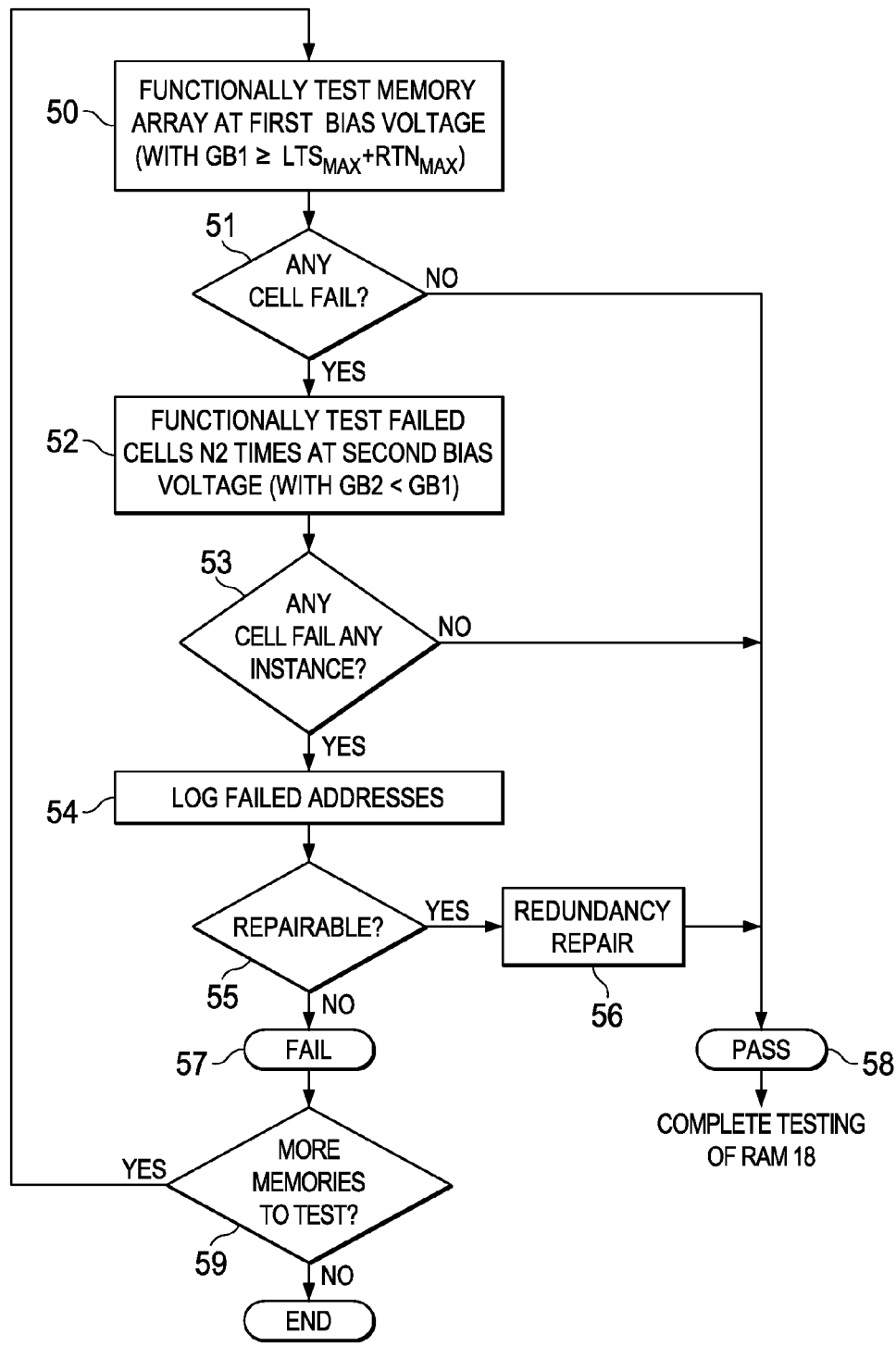
FIGS. 6a and 6b are flow diagrams illustrating test sequences according to embodiments of the invention.

Referring now to FIG. 6a, a method of testing memory cells, and a population of integrated circuits including memory arrays, to ensure long-term reliability by screening out cells and memories that are vulnerable to long-term shift and RTN effects, according to an embodiment of the invention, will now be described. It is contemplated that this method of FIG. 6a may be applied to solid-state memories in wafer form (i.e., at the end of a conventional wafer fabrication process flow, prior to packaging), or to solid-state memories as stand-along integrated circuits or embedded within large-scale integrated circuits (e.g., the SoC of integrated circuit 10 of FIG. 2) after packaging, either by the manufacturer or by the end user of the memories. In any case, it is contemplated that this method will typically be carried out by automated test equipment, as commonly used in high volume testing of memories and integrated circuits.

Prior to the particular test process shown in FIG. 6a, one or more functional and parametric tests will typically have already been performed on the integrated circuit containing the memory under test, to confirm functionality of the memory at nominal or specification power supply voltages and input/output levels, and to confirm that the memory and its integrated circuit environment can meet the basic specifications of performance, leakage, power dissipation, and the like.

For purposes of this description, the test sequence of FIG. 6a will be described as being performed on RAM 18 of integrated circuit 10 of FIG. 2 by way of example; as mentioned above, it is to be understood this test sequence is suitable for any sort of solid-state memory, including stand-alone memories, embedded memories, read-only memories, individual memory blocks in multi-block solid state memories, among others. In process 50, memory array 20 is subjected to a functional test at a first bias voltage level. For purposes of this description, the functional testing of memory array 20 involves the testing of an operational memory, in contrast to testing simple test structures. In the SRAM context, functional testing involves the writing of data into each memory cell by way of digital write circuitry, and the reading of data from each memory cell by amplifying bit line signals using differential or single-ended sense amplifiers; in the general sense, an example of such digital write circuitry and sense amplifiers are shown in the architecture of FIG. 3 as read/write circuits 24. The particular functional test applied in process 50 will depend on the type of memory being exercised. In the case of SRAM arrays, such as memory array 20 of FIG. 3, a suitable functional test is the well-known "march" test. As known in the art, a typical "march" test applies the sequence of cycles: write "0", read "0", write "1", read "1" to each memory cell 30 in sequence (e.g., in a "row-fast" direction). Of course, functional test of a read-only memory according to embodiments of this invention will differ from that sequence, and will typically involve simply reading the data state stored by each memory cell under the applied bias condition.

The first bias voltage level applied to memory array 20, in the functional test of process 50, refers to the voltage level for the one (or more) of the bias voltages used to evaluate the cell strength of each memory cell 30 in memory array 20. In the SRAM context, for example, this voltage may be one of those bias voltages specified in Table I above. The first bias voltage level used in process 50 includes a relatively aggressive guardband GB1, selected to identify (as "good") those memory cells that are sufficiently strong that even the combination of the maximum expected long-term shift (LTS) and RTN modulation will not exceed the limit Vmin_lim during the expected operational life of the integrated circuit. As known in the art, the Vmin effect of long-term shift and RTN modulation typically varies from device to device. Referring to FIG. 4b by way of example, the first bias voltage level for the power supply voltage $V_{dda}$ applied to memory array 20 in process 50 would be at or below the voltage [Vmin_lim−(LTS$_{max}$+RTN$_{max}$)], where LTS$_{max}$ and RTN$_{max}$ are the worst case (maximum expected) Vmin shifts due to long-term shift and RTN effects, respectively. For example, using power supply voltage $V_{dda}$ as the control voltage, if the limit Vmin_lim is a power supply voltage $V_{dda}$ of 0.900 volts, the worst case expected long-term shift (LTS$_{max}$) voltage is about 45 mV, and if the worst case RTN effect (RTN$_{max}$) is about 20 mV, guardband GB1 will be at least 65 mV, and thus the first bias voltage level used in process 50 will be a power supply voltage $V_{dda}$ of 0.835 volts or lower. If the particular voltage used in process 50 for applying the guardband condition differs from power supply voltage $V_{dda}$, the aggressive guardband GB1 used in process 50 can be derived by characterization, theory, or other empirical results, as may be determined to conclude, with reasonable confidence, that a given memory cell will meet the limit Vmin_lim over its operating life, even if RTN events occur.

The functional test of process 50 need only be performed once. In other words, for the example of the "march" test described above, this functional test need only read and write each memory cell 30 in array 20 through a single pass (e.g., with both data states at each memory cell) through array 20. Decision 51 determines whether any memory cell 30 failed the functional test at the first bias voltage level (with guardband GB1); if not (decision 51 is "no"), memory array 20 is concluded to pass this test sequence (process 58), and testing continues for additional memory arrays in the same integrated circuit, or additional integrated circuits containing memory arrays, as the case may be (via decision 59).

If one or more memory cells 30 failed the functional test of process 50 (decision 51 is "yes"), functional test process 52 is then performed. In functional test process 52, some or all memory cells 30 in memory array 20, including any cells 30 that failed the functional test of process 50, are repeatedly functionally tested for a selected number N2 of times, at a second bias voltage level having a guardband GB2. It is contemplated that the functional test performed in process 52 will be the same functional test (e.g., "march") as performed in process 50, with the second bias voltage level being a different voltage level for the same bias voltage that was set to include guardband GB1 in process 50, for consistency of result. The number N2 of repeated functional tests applied in process 52 is contemplated to be a number that provides some reasonable likelihood of detecting an RTN event; for example, it is contemplated that this number N2 can be on the order of ten to fifty (or higher). Guardband GB2 included within this second bias voltage level applied in process 52 is contemplated to be at least as stringent as necessary to identify (as "good") those memory cells 30 that, even with a worst case long-term shift (LTS$_{max}$), will not fail the limit Vmin_lim during the expected operational life. Guardband GB2 will be a less severe guardband than guardband GB1 of process 50, however. For the example given above, in which limit Vmin_lim is a power supply voltage $V_{dda}$ of 0.900 volts and the expected worst case long-term shift (LTS$_{max}$) voltage is about 45 mV, guardband GB1 will be at least 45 mV, and the second bias voltage level (of power supply voltage $V_{dda}$) used in process 52 will be a power supply voltage $V_{dda}$ of 0.855 volts or lower (but above the first bias voltage level used in process 50).

According to this embodiment of the invention, the repeated functional test of process 52 is intended to identify those memory cells 30 (and memory arrays 20, as the case may be) that may have an initial (time $t_0$) Vmin that is close to but sufficient to withstand the maximum expected long-term shift ($LTS_{max}$) over the expected operating life, but that do not appear to be vulnerable to RTN events, if no such event appeared during the N2 repetitions of the functional test in process 52. As such, decision 53 determines whether any memory cell 30 tested in process 52 failed any instance of the functional test; if not (decision 53 is "no"), memory array 20 is identified in process 58 as having passed the test sequence. The remainder of the overall test program is then applied to this RAM 18.

It is contemplated that the number of memory cells 30 functionally tested (N2 times) in process 52 may be a subset of memory cells 30 functionally tested in process 50, so long as those memory cells 30 tested in process 52 include those cells that failed the test of process 50. By functionally testing only a subset of memory array 20, the test time required for the N2 repetitions of the functional test in process 52 can be reduced, rendering the overall test process more efficient. The particular subset may be only the single memory block containing the failed cell or cells, if memory array 20 under test is arranged in multiple array blocks. Alternatively, the subset may be restricted to the data word containing the failed cell or cells 30, or some partial array block sharing at least a portion of the memory address as the failed cell or cells 30 (e.g., cells in the same row, the same column, the same group of four columns, the same sub-block, etc.) This reduction in the number of memory cells 30 tested may allow for additional repetitions of the functional test (i.e., for the number N2 to increase) for the same test time, improving the likelihood of detecting an RTN event during process 52. Of course, process 52 may functionally test entire memory array 20, if desired.

If one or more memory cell 30 of those tested in process 52 fails any of the N2 instances of the functional test (decision 53 is "yes"), those cells 30 are identified as failures according to this embodiment of the invention. It is contemplated that these failing memory cells 30 failed due to an RTN event occurring within the N2 instances of the functional test in process 52; of course, any cell 30 that failed all N2 instances of the functional test in process 52 may be failing for some other reason. If RAM 18 is constructed to include redundant memory cells, typically in the form of either or both redundant rows or redundant columns, the memory addresses of those cells 30 having failed one of the N2 instances in process 52 are logged in process 54 (typically by the automated test equipment carrying out the test sequence). Decision 55 determines whether the number and addresses of the failed memory cells 30 logged in process 54 are such that the available redundancy can fully replace those failed memory cells 30 in the address map of RAM 18. If so (decision 55 is "yes"), redundancy is enabled and mapped in the conventional manner for those failed cells in process 56; process 56 may also included the appropriate functional test, including the test sequence of FIG. 6a for those redundant cells to establish robustness over time and in light of RTN events. Upon successful repair in process 56, memory array 20 is then considered as having passed the test sequence (process 58), and the remainder of the overall test program is applied to this particular RAM 18.

On the other hand, if memory array 20 is not repairable (decision 55) due to the number of memory cells 30 (and their addresses) having failed one or more of the N2 instances of the functional test applied in process 52, RAM 18 is identified as having failed the test sequence (process 57). Decision 59 determines whether additional memories remain to be tested; if so (decision 59 is "yes") control returns to process 50 for the testing of the next memory resource according to this test sequence.

Figure 6B:
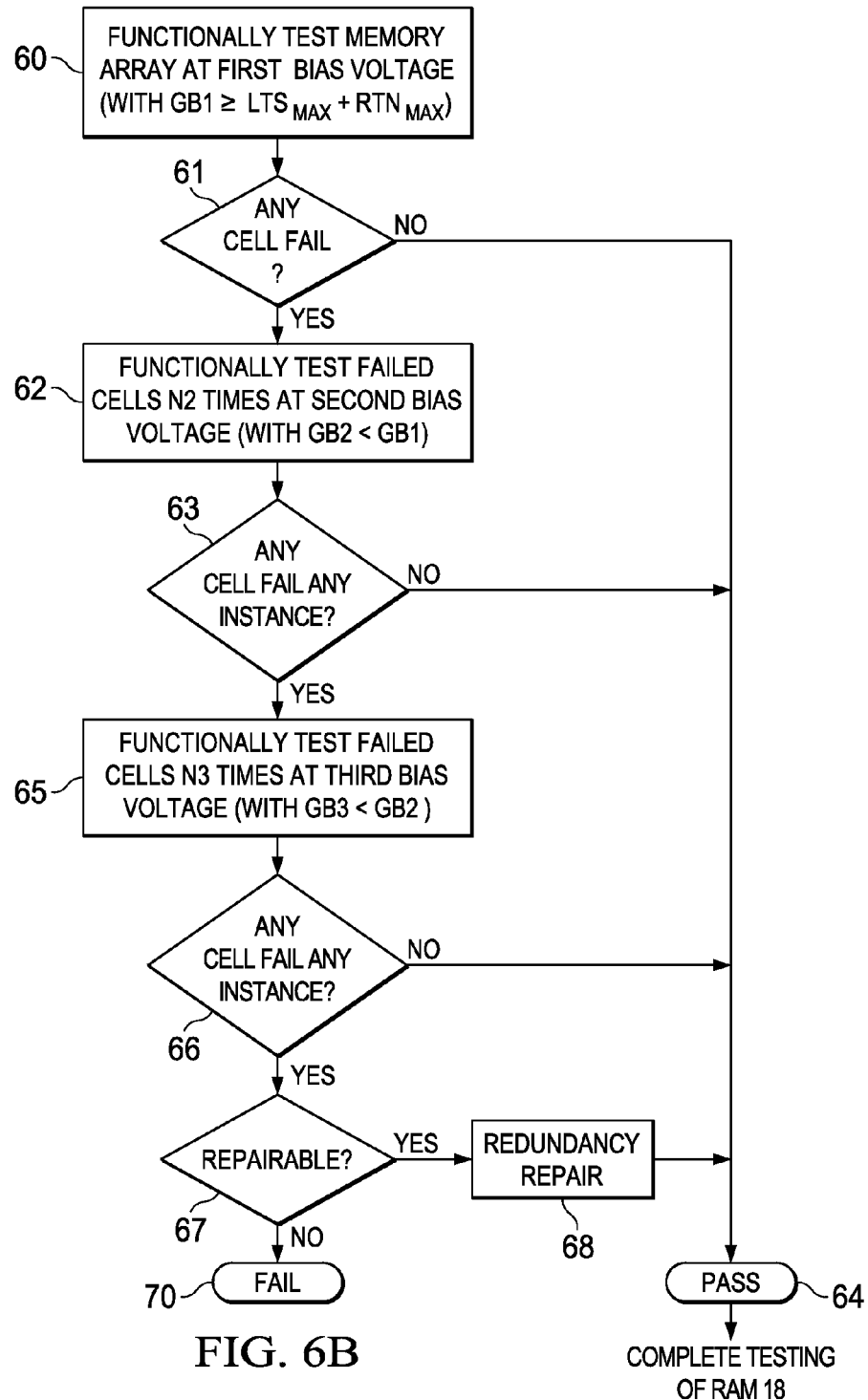

Other alternative implementations of the test method according to embodiments of this invention are contemplated. One such alternative embodiment of the invention is illustrated in FIG. 6b, and will now be described, with reference to the example of RAM 18. As will become apparent to those skilled in the art, the approach of FIG. 6b provides an efficient way to increase visibility into RTN events, by increasing the number of instances of a functional test at a finer resolution, without significantly increasing the overall test time of the device.

The process of FIG. 6b begins with process 60, in which all memory cells 30 in memory array 20 are functionally tested with the particular bias voltage (e.g., power supply voltage $V_{dda}$, reference voltage $V_{ssa}$, bit line precharge voltage $V_{ddp}$, n-well voltage $V_{nwell}$, p-well voltage $V_{pwell}$) 1 at a voltage level including a first guardband GB1 selected to identify (as "good") those memory cells that are sufficiently strong that even the combination of the worst case long-term shift ($LTS_{max}$) and worst case RTN modulation ($RTN_{max}$) will not exceed the limit Vmin_lim during the expected operational life of the integrated circuit. For the case of power supply voltage $V_{dda}$ as the bias voltage, the level applied in process 60 would be below the voltage [Vmin_lim−($LTS_{max}$+RTN$_{max}$)]. The functional test applied in process 60 may be a single instance (i.e., each memory cell is tested once), for example according to a "march" test pattern in the context of RAM 18. As before, if no memory cell 30 fails this stringent voltage with guardband GB1 (decision 61 is "no"), memory array 20 is deemed to have passed this test sequence (decision 64), and functional and parametric testing of memory array 20 continues according to the test program being executed by the automated test equipment or otherwise.

If one or more memory cells 30 fail the functional test of process 60, with the first bias voltage level including guardband GB1, functional test process 62 is then applied to some or all of memory array 20, including those failed memory cells 30 and such other memory cells 30 as desired or convenient. In functional test process 62, the same functional test pattern (e.g., "march") is applied to memory cells 30 to be tested, at a level of the bias voltage incorporating a second guardband GB2. According to this embodiment of the invention, second guardband GB2 from which the bias voltage level is derived for process 62 is contemplated to be at least as stringent as necessary to identify (as "good") those memory cells 30 that, even with a worst case long-term shift ($LTS_{max}$), will not fail the limit Vmin_lim during the expected operational life (for the example of power supply voltage $V_{dda}$ as the bias voltage). It is contemplated that guardband GB2 is a less severe guardband than guardband GB1 of process 60. In process 62, the functional test sequence is applied repeatedly, to those memory cells 30 under test, for N2 number of times. The number N2 may be on the order of ten times or greater.

Decision 63 is executed by the automated test equipment executing the overall test sequence to determine whether any memory cell 30 tested in process 62 failed any of the N2 instances of the functional test. If none failed any instance (decision 63), the test sequence of FIG. 6b concludes that memory array 20 passes the test sequence of FIG. 6b (process 64), because none of the memory cells 30 that were considered "suspect" as failing the stringent guardband GB1 of process 60 exhibited RTN effects in the N2 instances of process 62. If any memory cell 30 fails any of the N2 instances of functional test 62, however (decision 63 is "yes"), functional test 65 is then performed on a subset of memory array 20 including those failed memory cell or cells 30. In process 65, the same functional test pattern (e.g., "march") is applied to that identified subset of memory cells 30, but with the bias voltage (e.g., power supply voltage $V_{dda}$) at a voltage level according to a third guardband GB3. Guardband GB3 is contemplated to be less stringent than guardband GB2 of process 62; however, the number N3 of instances of the functional test pattern applied in process 65 is significantly greater than the number N2 of instances of the functional test of process 62. For example, if number N2 is ten, number N3 may be on the order of fifty or greater. As such, the additional functional instances of the test sequence applied in process 65 increases the probability that an RTN event will occur at the tested memory cells 30; the guardband GB3 is reduced, for example to a level close to the maximum expected long-term shift ($LTS_{max}$) threshold for the case of Vmin measurement, so as to reduce the number of "false failures" from the overall test sequence of FIG. 6b.

Upon completion of process 65, decision 66 is then executed to determine whether any memory cells 30 failed any instance of the functional test of process 65. If not (decision 66 is "no"), then memory array 20 is deemed to have passed this test sequence (decision 64), and functional and parametric testing of memory array 20 continues. However, if any memory cell 30 fails any instance of the functional test of process 65 (decision 66 is "yes"), decision 67 determines whether the number and addresses of the failed memory cells 30 (logged during the test sequence processes 60, 62, 65, or otherwise logged by the automated test equipment) indicate that the available redundancy in memory array 20 can replace those failed memory cells 30. If so (decision 67 is "yes"), redundancy is enabled and mapped in the conventional manner for those failed cells in process 68, along with any appropriate functional test of those now-enabled redundant cells. If the repair of process 68 is successful memory array 20 is considered as having passed the test sequence (process 64), and the remainder of the overall test program is applied to this particular RAM 18.

As before, if decision 67 determines that insufficient redundant cells are available to repair all failed memory cells 30 identified in functional process 65 (decision 67 is "no"), then memory array 20 is considered to have failed the test sequence (process 70) and the appropriate disposition of integrated circuit 10 is then made.

According to embodiments of this invention, substantial improvement in the identification of memory cells susceptible to Random Telegraph Noise (RTN) is provided, particularly in combination with the tendency of many deep sub-micron transistors and integrated circuits to performance degradation over time (e.g., NBTI). Embodiments of this invention attain this improved RTN screening in a manner that does not unduly impact test yield by over-screening, as in conventional test sequences, and without unduly lengthening the test time for passing memory arrays. It is therefore contemplated that the economic impact of embodiments of this invention can be significant, especially for integrated circuits with memory arrays constructed with transistors in the deep sub-micron feature size regime.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of testing cell strength for a solid-state memory comprised of a population of memory cells, the method comprising:
    performing a functional test of the population of memory cells at a first bias voltage level corresponding to a nominal voltage limit modified by a first guardband voltage;
    responsive to at least one memory cell of the population of memory cells failing the functional test at the first bias voltage level, performing a functional test of one or more memory cells including the failing memory cell at a second bias voltage level, for a first plurality of repetitions, the second bias voltage level corresponding to the nominal voltage limit modified by a second guardband voltage that is less severe than the first guardband voltage; and
    responsive to none of the one or more memory cells failing the functional test at the second bias voltage level for any of the first plurality of repetitions, identifying the memory as passing the cell strength test.

2. The method of claim 1, wherein the solid-state memory is a static random access memory;
    and wherein the functional test comprises write and read accesses for both a "0" and a "1" data state.

3. The method of claim 1, wherein the one or more memory cells including the failing memory cell comprises all memory cells in the population of memory cells.

4. The method of claim 1, wherein the one or more memory cells including the failing memory cell comprises fewer than the population of memory cells.

5. The method of claim 4, wherein the memory array comprises a plurality of array blocks within a single integrated circuit;
    and wherein the one or more memory cells including the failing memory cell comprises at least one of the plurality of array blocks.

6. The method of claim 4, wherein the one or more memory cells comprises only one or more failing memory cells.

7. The method of claim 4, wherein the one or more memory cells including the failing memory cell comprises memory cells corresponding to a memory address.

8. The method of claim 4, wherein the one or more memory cells including the failing memory cell comprises memory cells corresponding to a portion of a memory address.

9. The method of claim 1, further comprising:
    logging a memory address for a memory cell failing at least one repetition of the functional test at the second bias voltage level; and
    mapping a redundant memory cell to the logged memory address.

10. The method of claim 1, further comprising:
    responsive to at least one memory cell failing the functional test at the second bias voltage level, performing a functional test of one or more memory cells including the failing memory cell at a third bias voltage level, for a second plurality of repetitions, the third bias voltage level corresponding to the nominal voltage limit modified by a third guardband voltage that is less severe than the second guardband voltage.

11. The method of claim 10, wherein the one or more memory cells on which the performing step performs the functional test at the third bias voltage level number the same as the one or more memory cells on which the performing step performs the functional test at the second bias voltage level.

12. The method of claim 10, wherein the one or more memory cells on which the performing step performs the functional test at the third bias voltage level number fewer than the one or more memory cells on which the performing step performs the functional test at the second bias voltage level.

13. The method of claim 10, wherein the second plurality of repetitions is greater than the first plurality of repetitions.

14. The method of claim 1, wherein each memory cell is biased at a power supply voltage relative to a reference voltage;
   wherein the nominal voltage limit corresponds to a selected level of the power supply voltage;
   wherein the first bias voltage level corresponds to a first selected power supply voltage level below the nominal voltage limit by the first guardband voltage;
   and wherein the second bias voltage level corresponds to a second selected power supply voltage level below the nominal voltage limit by the second guardband voltage.

15. The method of claim 1, wherein each memory cell is biased at a power supply voltage relative to a reference voltage;
   wherein the nominal voltage limit corresponds to a selected differential voltage between the power supply voltage and a nominal reference voltage level;
   wherein the first bias voltage level corresponds to a first selected reference voltage above the nominal reference voltage level by the first guardband voltage;
   and wherein the second bias voltage level corresponds to a second selected reference voltage above the nominal reference voltage level by the second guardband voltage that is less than the first guardband voltage.

16. The method of claim 1, wherein each memory cell comprises a pair of cross-coupled inverters, each inverter comprising a p-channel MOS transistor connected in series with an n-channel MOS transistor between a power supply voltage and a reference voltage, and having gates connected in common;
   wherein the nominal voltage limit corresponds to a nominal back-gate bias voltage applied to the p-channel MOS transistors in each of the inverters;
   wherein the first bias voltage level corresponds to a first selected back-gate bias voltage above the nominal back-gate bias voltage by the first guardband voltage;
   and wherein the second bias voltage level corresponds to a second selected back-gate bias voltage above the nominal back-gate bias voltage by the second guardband voltage that is less than the first guardband voltage.

17. The method of claim 1, wherein each memory cell comprises a pair of cross-coupled inverters, each inverter comprising a p-channel MOS transistor connected in series with an n-channel MOS transistor between a power supply voltage and a reference voltage, and having gates connected in common;
   wherein the nominal voltage limit corresponds to a nominal back-gate bias voltage applied to the n-channel MOS transistors in each of the inverters;
   wherein the first bias voltage level corresponds to a first selected back-gate bias voltage below the nominal back-gate bias voltage by the first guardband voltage;
   and wherein the second bias voltage level corresponds to a second selected back-gate bias voltage below the nominal back-gate bias voltage by the second guardband voltage that is less than the first guardband voltage.

18. The method of claim 1, wherein each memory cell comprises first and second cross-coupled inverters coupled to first and second bit lines, respectively, by respective ones of first and second pass-gate transistors;
   wherein the nominal voltage limit corresponds to a nominal bit line precharge voltage applied to the first and second bit lines at the beginning of an access cycle;
   wherein the first bias voltage level corresponds to a first selected bit line precharge voltage above the nominal bit line precharge voltage by the first guardband voltage;
   and wherein the second bias voltage level corresponds to a second selected bit line precharge voltage above the nominal bit line precharge voltage by the second guardband voltage that is less than the first guardband voltage.

19. A method of testing integrated circuits, each integrated circuit including a memory array of memory cells, the method comprising:
   for each of the integrated circuits, functionally testing its memory array at a first bias voltage level applied to each memory cell, the first bias voltage level corresponding to a nominal voltage limit modified by a first guardband voltage; and
   for each integrated circuit including at least one memory cell failing at the first bias voltage level, functionally testing, for a plurality of repetitions, at least one memory cell including the failing memory cell at a second bias voltage level corresponding to the nominal voltage limit modified by a second guardband voltage that is less severe than the first guardband voltage.

20. The method of claim 19, further comprising:
   for each integrated circuit including at least one memory cell failing at least one repetition of the functional test at the second bias voltage level, logging a memory address for the failing memory cell; and
   mapping a redundant memory cell in the memory array to the logged memory address.

21. The method of claim 19, wherein each of the plurality of integrated circuits is in wafer form.

22. The method of claim 19, wherein each of the plurality of integrated circuits is in packaged form.

23. The method of claim 19, wherein the first guardband voltage corresponds to an expected time-dependent voltage shift plus a voltage shift corresponding to effects of random telegraph noise.

24. The method of claim 23, wherein the second guardband voltage corresponds to the expected time-dependent voltage shift.

25. The method of claim 19, wherein the memory cells are static random access memory cells;
   and wherein the functionally testing steps each comprise, for each memory cell tested, for each of a "0" data state and a "1" data state:
      writing the data state to the memory cell;
      then reading the memory cell.

26. The method of claim 19, wherein the one or more memory cells including the failing memory cell comprises all memory cells in the memory array.

27. The method of claim 19, wherein the one or more memory cells including the failing memory cell comprises fewer than all memory cells in the memory array.

* * * * *